United States Patent [19]

Kajihata et al.

[11] 4,263,520

[45] Apr. 21, 1981

[54] SIGNAL DETECTING CIRCUIT FOR ELECTRONIC MUSICAL INSTRUMENT

[75] Inventors: Munetoshi Kajihata; Koji Aoyama, both of Hamamatsu, Japan

[73] Assignee: Nippon Gakki Seizo Kabushiki Kaisha, Hamamatsu, Japan

[21] Appl. No.: 30,735

[22] Filed: Apr. 17, 1979

[30] Foreign Application Priority Data

Apr. 19, 1978 [JP] Japan ................................ 53-46044

[51] Int. Cl.[3] ........................................ H03K 5/153

[52] U.S. Cl. .................................... 307/350; 84/1.16; 84/267; 307/358; 307/362; 328/114; 328/132

[58] Field of Search ............... 307/350, 358, 362, 308; 340/146.3 AG; 84/9, 267, 1.01, 1.16; 328/114, 132

[56] References Cited

U.S. PATENT DOCUMENTS

| | | | |
|---|---|---|---|
| 4,038,897 | 8/1977 | Murray et al. | 84/1.16 |
| 4,080,574 | 3/1978 | Loosemore et al. | 307/362 X |
| 4,151,775 | 5/1979 | Merriman | 84/1.16 X |

*Primary Examiner*—John Zazworsky
*Attorney, Agent, or Firm*—Spensley, Horn, Jubas & Lubitz

[57] ABSTRACT

A detection circuit for detecting the rise of vibration of a string of a musical instrument such as a guitar capable of producing a trigger signal accurately at each flipping of the string. The circuit comprises a first system in which a signal obtained by full-wave rectifying a picked up signal from a pickup is compared with a predetermined reference level in a first comparator to produce a first signal, a second system in which a signal obtained by half-wave rectifying the picked up signal and integrating it thereafter is compared in a second comparator with a signal obtained by level-shifting the picked up signal by a predetermined level and a second signal is produced by delaying the speed of response of the output of the second comparator, and a flip-flop circuit to which the first and second signals are applied. The flip-flop outputs a signal each time player flips the string, which is used as a trigger signal for an electronic musical instrument driven by the above-said picked up signal.

4 Claims, 4 Drawing Figures

SIGNAL DETECTING CIRCUIT FOR ELECTRONIC MUSICAL INSTRUMENT

BACKGROUND OF THE INVENTION

This invention relates to a signal detecting circuit for an electronic musical instrument in which an acoustic vibration is picked up to generate an electrical signal which is used as the input signal to drive the electronic musical instrument.

An electronic musical instrument of this type, such as a so-called guitar synthesizer is provided with a function to trigger off a musical tone in accordance with the external vibration signal and a function to store and hold the external vibration signal (such as a string vibration signal) so that, even after the vibration of a string has been stopped, the musical tone can be produced.

These functions are obtained for instance in the following manner: First, the vibration of a string is detected by a pickup to provide an electrical signal, from which the fundamental wave is extracted, and a voltage signal corresponding to the frequency of the fundamental wave is provided. Then, the voltage signal thus provided is stored in a capacitor or the like, so that a voltage-controlled oscillator is driven by the voltage signal thus stored, thereby to produce a musical tone signal having a frequency corresonding to the relevant string. A timing of flipping the string is detected according to the aforementioned electrical signal to provide a detection signal. Then, this detection signal is used as a trigger signal to produce a series of control waveforms from a control waveform generator or the like. The control waveforms are used to drive a voltage-controlled filter and a voltage-controlled amplifier, so that the musical tone signal is subjected to tone color control and amplitude control for production of a musical tone.

In the electronic musical instrument of the type described above, the detection of the above-described flipping timing plays an important role, and it is necessary that, even if the string is flipped in succession, the trigger signal should be provided positively at each flipping of the string.

SUMMARY OF THE INVENTION

Accordingly, an object of the invention is to provide a circuit for producing the above-described trigger signal which is applicable to an electronic musical instrument, the circuit being capable of positively producing the trigger signal at each flipping of a string.

This invention utilizes a phenomenon that the vibration of the string is abruptly damped at an instant when the player touches the string for flipping it, even when the string is flipped in succession. According to the invention, the trigger signal is positively produced by detecting this phenomenon. In other words, at an instant when the player depresses the string with his left hand finger or he touches the string with a pick or a right hand finger for flipping it, the vibration of the string is abruptly and instantly damped and the flipping timing is detected by utilizing this abrupt damping.

The principle, nature and utility of the invention will become more apparent from the following detailed description when read in conjunction with the accompanying drawings.

DESCRIPTION OF A PREFERRED EMBODIMENT

Figure 1:
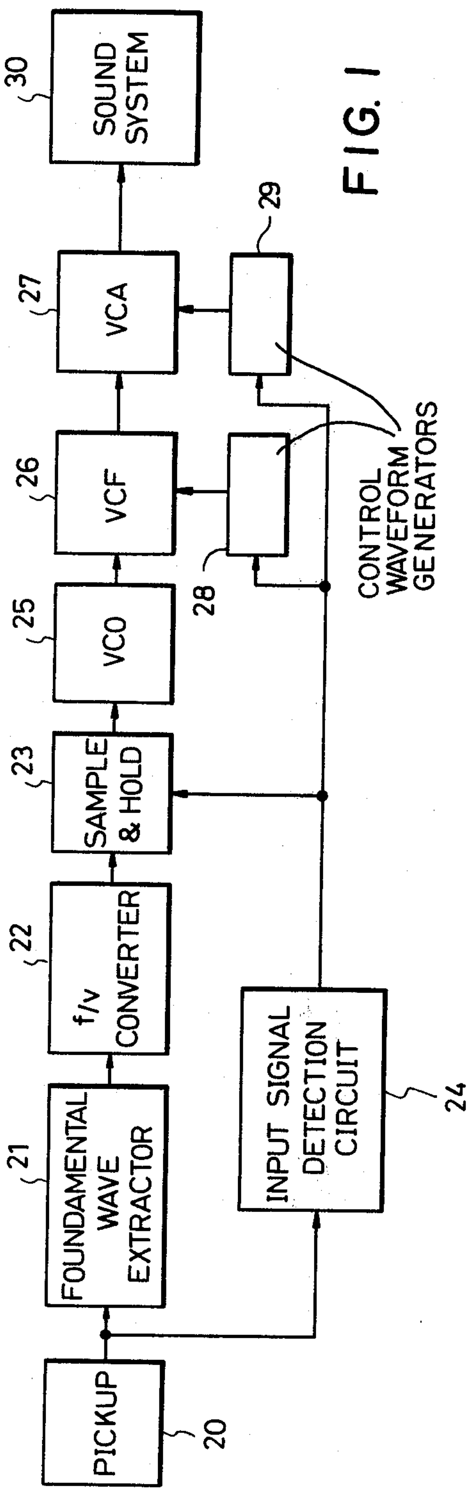
FIG. 1 is a block diagram showing an example of an electronic musical instrument to which the input signal detection circuit according to this invention is applicable.

Referring first to FIG. 1, an example of an electronic musical instrument to which the input signal detection circuit of the present invention is applicable will be described.

Figure 2:
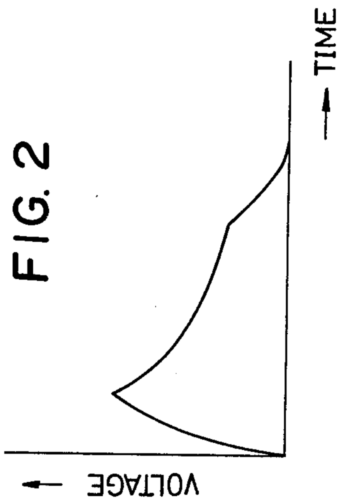
FIG. 2 is a graphical diagram showing an example of an envelope shape stored in envelope generators shown in FIG. 1.

A pickup 20 is provided for detecting vibration of an acoustic tone source such as a string of a musical instrument such as a guitar. A known pickup device of electromagnetic type, piezoelectric type or other may be used as the pickup 20. A detected electrical signal outputted by the pickup 20 is applied to a fundamental wave extractor 21 where a fundamental wave contained in this signal is extracted. The extracted fundamental wave is converted to a voltage corresponding to its frequency by a frequency-voltage converter 22 and the output voltage of the converter 22 is applied to a sample and hold circuit 23. The signal from the pickup 20 is also applied to an input signal detection circuit 24. The input signal detection circuit 24 detects, as will be described more fully later, the flipping of the string by detecting attenuation of the vibration of the string which occurs at an initial stage of flipping. The sample and hold circuit 23 samples and holds the voltage applied thereto in accordance with detection of the flipping by the input signal detection circuit 24. The voltage outputted by the sample and hold circuit 23 is applied to a voltage-controlled oscillator (VCO) 25 which in turn oscillates a signal corresponding in frequency to the voltage. This signal is controlled in tone color by a voltage-controlled filter (VCF) 26 and controlled in tone amplitude by a voltage-controlled amplifier (VCA) 27 and thereafter is supplied to a sound system 30. Control waveform generators 28 and 29 are provided for controlling the cut-off frequency of the VCF 26 and the gain of the VCA 27. These control waveform generators permanently store predetermined control waveform shapes (e.g. one shown in FIG. 2) and are triggered by the output of the signal detection circuit 24. More specifically, the control waveform generator 28 outputs a voltage signal as shown in FIG. 2 which rapidly rises at the initiation of the circuit 24 output, decays slowly thereafter and decays rapidly after the termination of the circuit 24 output, thereby controlling the cut-off frequency of the VCF 26 for controlling the tone color of the signal supplied by the VCO 25 (i.e. a tone signal). The control waveform generator 29 likewise outputs a voltage signal as shown in FIG. 2 as time elapses upon detection of the flipping of the string thereby controlling the gain of the VCA 27 for imparting an amplitude corresponding to the control waveform shape to the signal from the VCF 26 which has been controlled in tone color. In the above-described manner, a musical tone which has been controlled in both tone color and amplitude is produced by the sound system 30 at each flipping of the string.

Figure 3:
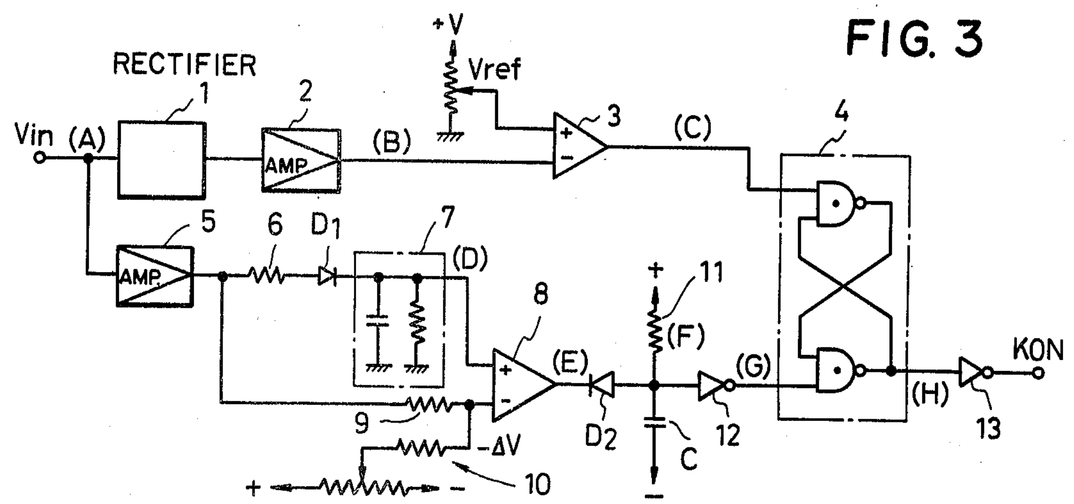
FIG. 3 is a block diagram showing an embodiment of this invention.

Referring now to FIG. 3, an embodiment of the input signal detection circuit 24 according to the invention will be described in detail.

Referring to FIG. 3, an input signal Vin is obtained from the pickup 20 detecting the vibration of a tone source of a musical instrument such as a string of a guitar. It is an AC signal in an audio frequency band as shown in the part A of FIG. 4, in which reference character t designates the time instant the finger or the like contacts the string.

Figure 4:
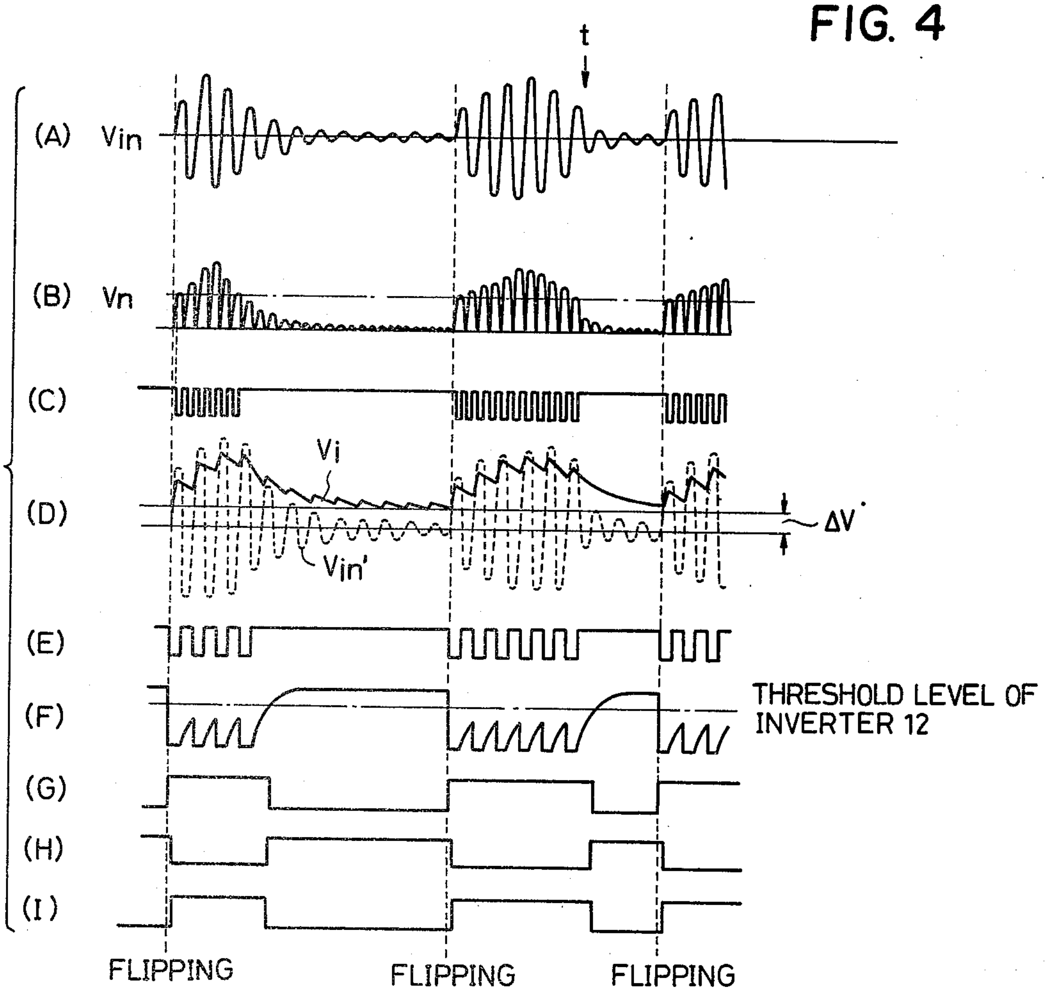
FIG. 4 is a timing chart for description of the operation of the embodiment shown in FIG. 3.

After being subjected to rectification, preferably full-wave rectification in a full-wave rectifier 1, the input signal Vin is applied through an amplifier 2 to a comparator 3 as an input signal Vn (indicated in the part B of FIG. 4). In the comparator 3, the input signal Vn is compared with a preset reference voltage Vref, and when Vref>Vn, a signal "1" is outputted. More specifically, as indicated in the part C of FIG. 4, the output of the comparator 3 is a pulse signal whose level is "1" and "0" alternately for a period of time from the instant that the envelope of the signal Vn becomes higher than the reference voltage Vn until the level of the signal Vn is descreased to the reference voltage Vref; and the output of the comparator 3 is a signal whose level is maintained at "1" for a period of time from the instant when the level of the signal Vn is attenuated to be lower than the reference voltage Vref until the next flipping. The level of the signal Vn is attenuated not only freely with the lapse of time but also forcibly by the contact of the pick or the finger when the string is flipped, that is, even when the string is flipped in succession, the level of the signal Vn becomes lower than the reference voltage Vref at the initiation of each flipping. The output of the comparator 3 is applied to one of the input terminals of an R-S flip-flop circuit 4 (described later).

The input signal Vin is further applied through an amplifier 5 and a resistor 6 to a rectifier $D_1$, where it is subjected to rectification, preferably half-wave rectification. The signal thus treated is converted into a signal Vi (indicated by the solid line in the part D of FIG. 4) in an integrator 7, which is applied to the non-inversion input terminal of a comparator 8, to the inversion input terminal of which the output signal of the amplifier 5 is applied through a resistor 9. As a voltage $-\Delta V$ is applied from a level shifter 10 to the inversion input terminal of the comparator 8, the level of the input signal to this input terminal is shifted by $-\Delta V$. Instead of negatively level-shifting the inversion input of the comparator 8, its non-inversion input may be level-shifted in a positive direction. The input signal Vin' applied to the inversion input terminal is indicated by the dotted line in the part D of FIG. 4. In the comparator 8, the integration signal Vi is compared with the shifted signal Vin', and when the integration signal is greater than the shifted signal, a signal "1" is outputted, and when the former is smaller than the latter, a signal "0" is outputted. In other words, in the case where the amplitudes of the signals Vin' and Vi are great, if the polarity of the input signal Vin' is positive (+), then Vin'>Vi and the comparator 8 outputs the signal "0"; if the polarity of the input signal Vin' is negative (−), then Vin'<Vi and the comparator 8 outputs the signal "1".

The input signal Vin' is shifted by $\Delta V$ towards the negative side, as was described above. Therefore, whenever the amplitude of the input signal Vin' is decreased, the relation Vin'<Vi is established and the comparator 8 outputs the signal "1". Accordingly, as indicated in the part E of FIG. 4, the output of the comparator 8 is a pulse signal whose level is at "1" and "0" alternatively for a while after the flipping and thereafter it is maintained at "1" for a period of time from the instant when the vibration is damped to be below a certain level with the lapse of time or it is damped when the pick or the finger is brought into contact with the string until the string is not flipped. At the time instant t when the pick or the finger is brought into contact with the string, the signal Vin' is abruptly decreased, but the signal Vi is slowly decreased, and therefore the output of the comparator 8 is positively maintained at "1".

A diode $D_2$ is connected to the output terminal of the comparator 8, with the polarity opposite to the direction of the output of the comparator 8. The diode $D_2$ is further connected through a resistor 11 to a positive voltage source and through a capacitor C to a negative voltage source. Thus, the capacitor C is charged and discharged selectively according to the output of the comparator 8. More specifically, when the output of the comparator 8 is at "1," then the diode $D_2$ is rendered non-conductive, and the capacitor C is gradually charged through the resistor 11; and when the output of the comparator 8 is at "0", then the diode $D_2$ is rendered conductive, and the capacitor C is discharged instantaneously through the conductive diode $D_2$. Thus, the charge-discharge waveform of the capacitor C is as indicated in the part F of FIG. 4. When the output (FIG. 4E) of the comparator 8 is the pulse signal whose level is at "1" and "0" alternately, the charging time is short, and therefore the maximum terminal voltage of the capacitor C is low; and when the output of the comparator 8 is maintained at "1" continuously, the charging time is long, and therefore the capacitor terminal voltage is high. The capacitor C and its associated charging and discharging paths thus function as a means for delaying a response speed of the output of the comparator 8.

The voltage across the capacitor C is applied to an inverter 12. The threshold level of the inverter 12 is set to a value higher than the capacitor terminal voltage when the output of the comparator 8 is the pulse signal having a level at "1" and "0" alternately, and lower than the capacitor terminal voltage when the output of the comparator 8 is at "1" continuously. In other words, the threshold level of the inverter 12 and/or time constant of the capacitor charging circuit is so designed that the threshold level is higher than the maximum terminal voltage even when a tone of the lowest pitch is applied to the pickup 20 from the tone source. Therefore, the output of the inverter 12 is lowered to "0" only when the output of the comparator 8 is at "1" continuously, as indicated in the part G of FIG. 4. The output of the inverter 12 is applied to the other input terminal of the aforementioned flip-flop circuit 4.

As the output of the comparator 3 (the part C of FIG. 4) and the output of the inverter 12 (the part G of FIG. 4) are applied to the input terminals of the R-S flip-flop 4 as described above, the output of the R-S flip-flop 4 is controlled according to the two inputs. More specifically, assuming that the input from the comparator 3 is a set input, the output of the inverter 12 is a reset input and the output H of the flip-flop 4 is set output, the flip-flop 4 is set or reset when one of the two inputs is "0" and the other is "1" whereas an input which has been inverted from "0" to "1" is given priority when the two inputs are both "1". Accordingly, if it is assumed that the output of the flip-flop 4 is at "1" before flipping is made, then as indicated in the part H of FIG. 4 the output of the flip-flop 4 is lowered to "0" when the output of the comparator 3 is lowered to "0" upon flipping. Thereafter, when the vibration is damped so that the output of the comparator 3 is raised to "1" and that the output of the inverter 12 is lowered to "0", the output of the flip-flop 4 is raised to "1". Furthermore, when the string is flipped again so that the output of the inverter 12 is raised to "1" and that the output of the comparator 3 is lowered to "0", then the output of the flip-flop 4 is lowered to "0" again.

The output of the R-S flip-flop 4 is inverted by an inverter 13, so that this output is a flipping indicating signal which can be used as a trigger signal for driving control waveform generator adapted to generate a musical tone controlling waveform signal.

As is clear from the above description, in this invention, the phenomenon that the vibration of a string is abruptly damped immediately before the string is flipped is utilized, and therefore the flipping of the string can be positively detected.

What is claimed is:

1. A signal detection circuit comprising:

a first rectifier for rectifying an input signal of an audio frequency band;

a first comparator for comparing the level of the output of said first rectifier with a reference level;

a second rectifier for rectifying said input signal;

an integrator for integrating the output of said second rectifier;

a second comparator for comparing the level of said input signal with the level of the output of said integrator;

means for delaying a response speed of the output of said second comparator;

means having a threshold level for generating an output comparing the output of said delaying means with the threshold level; and a flip-flop circuit controlled in accordance with the outputs of said first comparator and said threshold level means for generating an output representing rise and fall of said input signal.

2. A circuit according to claim 1, further comprising means for level-shifting one of said input signal level and said integrator output level before applied to said second comparator.

3. A circuit according to claim 1, in which said delaying means comprises a capacitor having a discharging path and a charging path which has a time constant larger than that of the discharging path, said capacitor being charged and discharged in accordance with the output of said second comparator.

4. A circuit according to claim, 1, in which said flip-flop circuit is an R-S flip-flop having two inputs respectively applied with the outputs of said first comparator and said threshold level means and an output in use for delivering said output representing rise and fall of said input signal.

* * * * *